United States Patent
Valentine et al.

(10) Patent No.: US 11,862,932 B2
(45) Date of Patent: Jan. 2, 2024

(54) LIGHT SOURCE WITH OPTICAL FREQUENCY MIXING

(71) Applicant: META PLATFORMS TECHNOLOGIES, LLC, Menlo Park, CA (US)

(72) Inventors: Gareth Valentine, Redmond, WA (US); Maik Andre Scheller, Redmond, WA (US); James Ronald Bonar, Redmond, WA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 394 days.

(21) Appl. No.: 17/124,319

(22) Filed: Dec. 16, 2020

(65) Prior Publication Data
US 2022/0187681 A1    Jun. 16, 2022

(51) Int. Cl.
| | | |
|---|---|---|
| H01S 3/10 | (2006.01) | |
| H01S 5/026 | (2006.01) | |
| H01S 5/00 | (2006.01) | |
| H01S 5/40 | (2006.01) | |
| H01S 5/10 | (2021.01) | |

(Continued)

(52) U.S. Cl.
CPC .......... *H01S 5/0268* (2013.01); *H01S 5/0092* (2013.01); *H01S 5/06206* (2013.01); *H01S 5/1092* (2013.01); *H01S 5/4087* (2013.01); *G02B 27/0172* (2013.01); *G02B 2027/0178* (2013.01); *G02F 1/3532* (2013.01); *H01S 3/109* (2013.01); *H01S 5/18397* (2013.01); *H04N 9/3161* (2013.01); *H04N 9/3164* (2013.01)

(58) Field of Classification Search
CPC .. H01S 5/0268; H01S 5/0092; H01S 5/06206; H01S 5/1092; H01S 5/4087; H01S 5/18397
See application file for complete search history.

(56) References Cited

U.S. PATENT DOCUMENTS

| | | | | |
|---|---|---|---|---|
| 5,640,405 A | * | 6/1997 | Wallace | G02F 1/3532 |
| | | | | 372/98 |
| 5,768,302 A | * | 6/1998 | Wallace | G02F 1/39 |
| | | | | 372/98 |

(Continued)

OTHER PUBLICATIONS

International Search Report and Written Opinion for International Application No. PCT/US2021/062975, dated Apr. 7, 2022, 10 pages.

(Continued)

*Primary Examiner* — Kinam Park
(74) *Attorney, Agent, or Firm* — Pequignot + Myers; Matthew A. Pequignot

(57) ABSTRACT

A light source based on an optical frequency mixer is disclosed. The light source has a first laser for emitting light at a first optical frequency, and a plurality of second lasers for emitting light at different second optical frequencies. The optical frequency mixer provides output light beams at mixed optical frequencies of the first and second lasers. Wavelength of output light beams may be tuned by tuning wavelength of any of the first or second lasers. In this manner, RGB wavelength-tunable light sources may be constructed based on red or near-infrared lasers. The wavelength tunability of the output light beams may be used to angularly scan or refocus the light beams.

11 Claims, 9 Drawing Sheets

(51) Int. Cl.
    *H01S 5/062*     (2006.01)
    *G02B 27/01*     (2006.01)
    *G02F 1/35*     (2006.01)
    *H01S 3/109*     (2006.01)
    *H04N 9/31*     (2006.01)
    *H01S 5/183*     (2006.01)

(56) References Cited

U.S. PATENT DOCUMENTS

| | | |
|---|---|---|
| 6,480,325 B1 | 11/2002 | Batchko et al. |
| 2001/0010698 A1* | 8/2001 | Kraenert .............. H01S 3/23 372/23 |
| 2006/0013270 A1* | 1/2006 | Yumoto .............. G02F 1/3775 372/21 |
| 2006/0280219 A1 | 12/2006 | Shchegrov |
| 2013/0294467 A1* | 11/2013 | Moloney .............. H01S 5/14 372/20 |
| 2018/0157149 A1* | 6/2018 | Marandi .............. H01S 5/0092 |
| 2021/0322621 A1* | 10/2021 | Tillmanns .............. A61L 9/20 |
| 2021/0349371 A1* | 11/2021 | Shakfa .............. H01S 5/0092 |

OTHER PUBLICATIONS

International Preliminary Report on Patentability for International Application No. PCT/US2021/062975, dated Jun. 29, 2023, 8 pages.

\* cited by examiner

LIGHT SOURCE WITH OPTICAL FREQUENCY MIXING

TECHNICAL FIELD

The present disclosure relates to active optical components and modules, and in particular to light sources, including wavelength-tunable light sources, and optical devices based thereon.

BACKGROUND

Visual displays are used to provide information to viewer(s) including still images, video, data, etc. Visual displays have applications in diverse fields including entertainment, education, engineering, science, professional training, advertising, to name just a few examples. Some visual displays, such as TV sets, display images to several users, and some visual displays are intended for individual users. Head mounted displays (HMD), near-eye displays (NED), and the like are being used increasingly for displaying content to individual users. The content displayed by HMD/NED includes virtual reality (VR) content, augmented reality (AR) content, mixed reality (MR) content, etc. The displayed VR/AR/MR content can be three-dimensional (3D) to enhance the experience and, for AR/MR applications, to match virtual objects to real objects observed by the user.

Compact display devices are desired for head-mounted displays. Because a display of HMD or NED is usually worn on the head of a user, a large, bulky, unbalanced, and/or heavy display device would be cumbersome and may be uncomfortable for the user to wear. Compact display devices require compact and efficient components and modules, such as light sources and image projectors. Miniaturization of optical components and modules enables other applications for light sources and image projectors, e.g. in mobile communication devices. These applications are not limited to displays and include tasks like remote sensing, 3D scanning, imaging, LIDAR, etc.

BRIEF DESCRIPTION OF THE DRAWINGS

Exemplary embodiments will now be described in conjunction with the drawings, in which.

DETAILED DESCRIPTION

Figure 1:
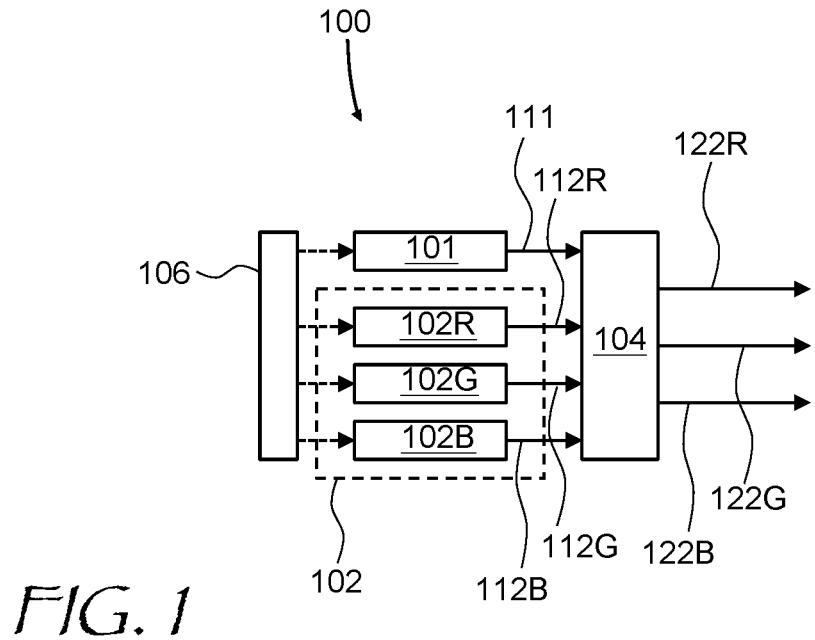
FIG. 1 is a schematic diagram of a light source of this disclosure.

While the present teachings are described in conjunction with various embodiments and examples, it is not intended that the present teachings be limited to such embodiments. On the contrary, the present teachings encompass various alternatives and equivalents, as will be appreciated by those of skill in the art. All statements herein reciting principles, aspects, and embodiments of this disclosure, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

As used herein, the terms "first", "second", and so forth are not intended to imply sequential ordering, but rather are intended to distinguish one element from another, unless explicitly stated. Similarly, sequential ordering of method steps does not imply a sequential order of their execution, unless explicitly stated. In FIGS. 1 to 7, similar reference numerals denote similar elements.

A portable/wearable display often requires the functionality of variable focusing and/or redirection of light beams carrying color channels of a displayed image. Beam scanners based on tiltable mirrors and varifocal lenses may be used for these purposes. However, mirror-based beam scanners and varifocal lens assemblies tend to be relatively bulky and heavy, with limited possibilities of miniaturization of these devices. One approach to provide beam redirecting/scanning and/or refocusing is to direct wavelength-tuned light beams at wavelength-dispersing optical elements, such as diffraction gratings, diffractive lenses, diffractive reflectors, etc. Diffractive optical elements can be made very thin. For example, they may be manufactured as surface-relief features on other optical elements. Diffractive optical components may also be written in a thin photosensitive transparent substrate and/or formed in a liquid crystal layer, to name just a few techniques and methods.

A plurality of collimated, wavelength-tunable light beams may be redirected by a diffraction grating depending the beams wavelengths. When the wavelengths of the beams are tuned, the beams themselves are angularly scanned by the diffraction grating. When the light beams are scanned across the entire field of view (FOV), an image in angular domain may be formed. At each moment of time, a direction of collimated light beams carrying red, green, and blue color channel corresponds to a pixel of an image being displayed. The wavelength of collimated light beams carrying color channels of pixels being displayed can be varied within certain limits to provide the desired beam redirecting and/or refocusing functionality by e.g. using corresponding diffractive components. Changing color coordinates of image pixels may be avoided or reduced by adjusting relative brightness of the light beams simultaneously with tuning the wavelength.

The wavelength and output power of a light source for a scanning color-tuned display needs to be variable at a frequency of up to approximately 200 kHz, with the wavelength tuning range of about 10 nm. To provide high selectivity of tuning the beam parameters by wavelength, the light sources need to be highly monochromatic, the spectral linewidth no greater than 10 pm in some applications. Due to the spectral bandwidth limitation, a tunable laser source may be required for each one of red, green, and blue color channel.

Visible laser sources satisfying the above stated requirements are not readily available, especially in the compact form required for wearable display devices. Such sources are, however, available in near infrared part of the spectrum, e.g. at optical telecommunications wavelengths. In accordance with this disclosure, nonlinear optical phenomenon of optical frequency mixing may be used to obtain visible light sources based on nonlinear optical conversion of light emitted by tunable laser sources emitting in invisible parts of optical spectrum such as infrared (IR) and ultraviolet (UV).

In accordance with the present disclosure, there is provided a light source comprising a first laser for emitting light at a first optical frequency, a plurality of second lasers for emitting light at different second optical frequencies, and an optical frequency mixer coupled to the first laser and to the plurality of second lasers for nonlinear optical mixing of optical frequencies of the light emitted by the first laser and the light emitted by each one of the plurality of second lasers, to provide a plurality of output light beams at mixed optical frequencies. The first laser may be a tunable laser for emitting light at a tunable optical frequency, and each second laser of the plurality of second lasers may be a fixed laser for emitting light at a fixed optical frequency. The first laser may be a fixed laser for emitting light at a fixed optical frequency, and each second laser of the plurality of second lasers may be a tunable laser for emitting light at a tunable optical frequency. The first laser and each second laser of the plurality of second lasers may be tunable.

A mixed optical frequency of each one of the plurality of output light beams may be a sum optical frequency of the first optical frequency and a particular one of the second optical frequencies. The plurality of output light beams may include a light beam at a red wavelength, a light beam at a green wavelength, and a light beam at a blue wavelength. The red, green, and blue wavelengths may be variable by tuning at least one of: the first laser; or a second laser of the plurality of the second lasers.

In some embodiments, the optical frequency mixer includes an optical routing element coupled to a plurality of nonlinear optical elements. The optical routing element may be configured for coupling the light at the first optical frequency to each one of the plurality of nonlinear optical elements, and for coupling the light at each second optical frequency to a particular one of the plurality of nonlinear optical elements. The optical routing element may include a photonic integrated circuit (PIC). Each one of the plurality of nonlinear optical elements may include a quasi-phase-matched nonlinear optical element. The quasi-phase-matched nonlinear optical element may include e.g. a poled crystalline material. A poling period of the poled crystalline material is chirped, with the poling period varying by at least 0.1% and no more than 50% of a median value of the poling period. A plurality of electrodes may be disposed in proximity of the poled crystalline material for providing a stationary or dynamically variable electrical field gradient along the poled crystalline material for varying phase matching of the poled crystalline material by using an electro-optical effect.

In accordance with the present disclosure, there is provided a tunable RGB light source comprising red, green, and blue light sources, each comprising a tunable laser and a nonlinear optical element coupled to that laser, and a controller operably coupled to the tunable lasers of the red, green, and blue light sources, for synchronous tuning of optical frequency of the tunable lasers. The nonlinear optical element of each one of the red, green, and blue light sources may include a frequency doubling nonlinear optical element.

At least one of the red, green, or blue light sources may include a plurality of lasers for providing multiple output light beams at different wavelengths of a same color channel. Each one of the red, green, and blue light sources may further include a fixed laser for emitting light at a fixed optical frequency, and an optical combiner for optically coupling the fixed laser and the tunable laser to the nonlinear optical element. The nonlinear optical element may be configured for mixing optical frequencies of the fixed laser and the tunable laser. For example, the nonlinear optical element may be configured for providing an output light beam at a sum optical frequency of the fixed laser and the tunable laser.

In accordance with the present disclosure, there is further provided a projector including any of the above light source (s) including a nonlinear optical element, which may be configured to double the tunable optical frequency. The light source may further include a fixed laser for emitting light at a fixed optical frequency. The fixed laser may be optically coupled to the nonlinear optical element. The nonlinear optical element may be configured to produce the first beam at a sum frequency of the fixed laser and the tunable laser. The light source may include a plurality of lasers coupled to nonlinear optical elements for providing a beam of visible light including the first beam, at a tunable optical frequency for each of red, green, and blue color channels.

Referring now to FIG. 1, a light source 100 includes a first laser 101 for emitting light 111 at a first optical frequency. A plurality 102 of second lasers, in this example a red color channel laser 102R, a green color channel laser 102G, and a blue color channel laser 102B, are provided for emitting light 112R, 112G, and 112B respectively at different second optical frequencies. An optical frequency mixer 104 is coupled to the first laser 101 and to the plurality 102 of second lasers 102R, 102G, and 102B for nonlinear optical mixing of optical frequencies of the light 111 emitted by the first laser 101 and the light 112R, 112G, and 112B, emitted by each one of the plurality of second lasers 102R, 102G, and 102B respectively. As a result of the nonlinear optical frequency mixing, output light beams are generated at mixed optical frequencies, including red 122R, green 122G, and blue 122B output light beams. The optical frequency mixer 104 provides nonlinear optical interaction of the light 111, 112R, 112G, and 112B emitted by the first 101 and second 101, 102R, 102G, and 102B lasers. The nonlinear optical interaction may include sum frequency generation, difference frequency generation, harmonic(s) generation, etc.

A controller 106 may be operably coupled to the first laser 101 and to the plurality 102 of second lasers 102R, 102G, and 102B for controlling optical power level and/or emission wavelength of these lasers, which impact the optical power levels and wavelengths/optical frequencies of the red 122R, green 122G, and blue 122B output light beams.

Specific embodiments of light sources and non-limiting examples of optical frequency mixing configurations will now be provided.

Figure 2:
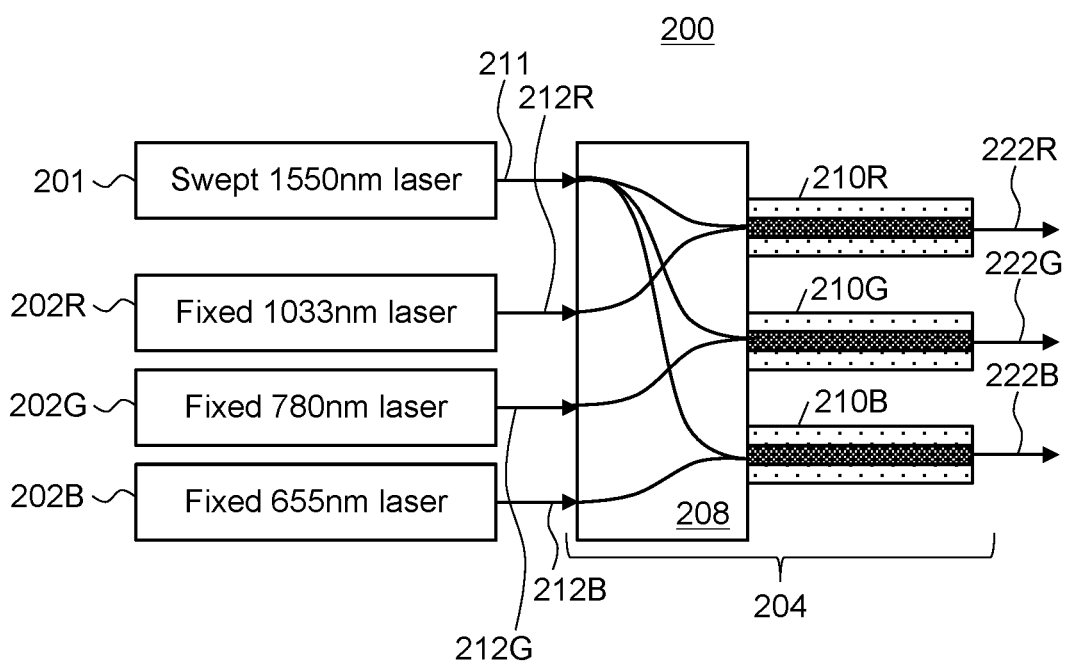
FIG. 2 is a schematic diagram of an embodiment of the light source of FIG. 1 including a tunable laser and a plurality of fixed lasers, illustrating the generation of tunable light at visible wavelengths from infrared light by sum frequency generation (SFG)

Referring to FIG. 2, a light source 200 is an embodiment of the light source 100 of FIG. 1. The light source 200 of FIG. 2 includes a tunable laser 201 emitting light 211 at a tunable optical frequency, and a plurality of fixed lasers, in this example a red color channel fixed laser 202R, a green color channel fixed laser 202G, and a blue color channel fixed laser 202B, emitting light 212R, 212G, and 212B, respectively at different fixed optical frequencies. In the specific non-limiting example shown, all four lasers are red or infrared lasers: the tunable laser 201 is tunable around a wavelength of 1550 nm, the red color channel fixed laser 202R emits light at a wavelength of 1033 nm, the green color channel fixed laser 202G emits light at a wavelength of 780 nm, and the blue color channel fixed laser 202B emits light at a wavelength of 655 nm.

An optical frequency mixer 204 of the light source 200 includes a photonic integrated circuit (PIC) 208 coupled to a plurality of nonlinear optical elements 210R, 210G, and 210B. The PIC 208 is configured for coupling the light 211 at the tunable optical frequency to each one of the plurality of nonlinear optical elements 210R, 210G, and 210B, and for coupling the light 212R, 212G, and 212B at each fixed optical frequency to one of the nonlinear optical elements 210R, 210G, and 210B, respectively. Each single light beam is coupled to a particular one of the plurality of nonlinear optical elements 210R, 210G, and 210B. A combination of optical splitters and combiners, e.g. Y-splitters/combiners, directional splitters/combiners, or another optical routing element or elements, may be used instead of the PIC 208 to provide the same functionality.

Each nonlinear optical element 210R, 210G, and 210B may include a quasi phase-matched nonlinear element, such as a poled lithium niobate (PPLN) crystal, or a thin film lithium niobate waveguide structure, for example. The quasi phase-matched nonlinear element may form a waveguide configured for co-propagating the light 211 at the tunable optical frequency together with the light 212R, 212G, or 212B at fixed optical frequencies. In the embodiment shown in FIG. 2, mixed optical frequencies of each one of red, green, and blue output light beams 222R, 222G, and 222B are sum frequencies of the first (tunable) optical frequency and a particular one of the second (fixed) optical frequencies of the red color channel fixed laser 202R, a green color channel fixed laser 202G, and a blue color channel fixed laser 202B. As the optical frequency of the tunable laser 201 is swept between a low value and a high value, the optical frequencies and wavelengths of the red, green, and blue output light beams 222R, 222G, and 222B are swept simultaneously between their corresponding low and high values. To provide a reasonable nonlinear conversion efficiency at each optical frequency of the light 211 at the tunable optical frequency, the poling period of the quasi phase-matched nonlinear element may be chirped, e.g. with the poling period varying by at least 0.1% and no more than 50% of a median value, for example. Herein and throughout the rest of the specification, the term "red light beam" or "red wavelength" denotes a wavelength range of monochromatic light that appears red to the viewer, e.g. between 600 nm and 750 nm; the term "green light beam" or "green wavelength" denotes a wavelength range of monochromatic light that appears green to the viewer, e.g. between 500 nm and 600 nm; and the term "blue light beam" or "blue wavelength" denotes a wavelength range of monochromatic light that appears blue to the viewer, e.g. between 350 nm and 500 nm.

Figure 3:
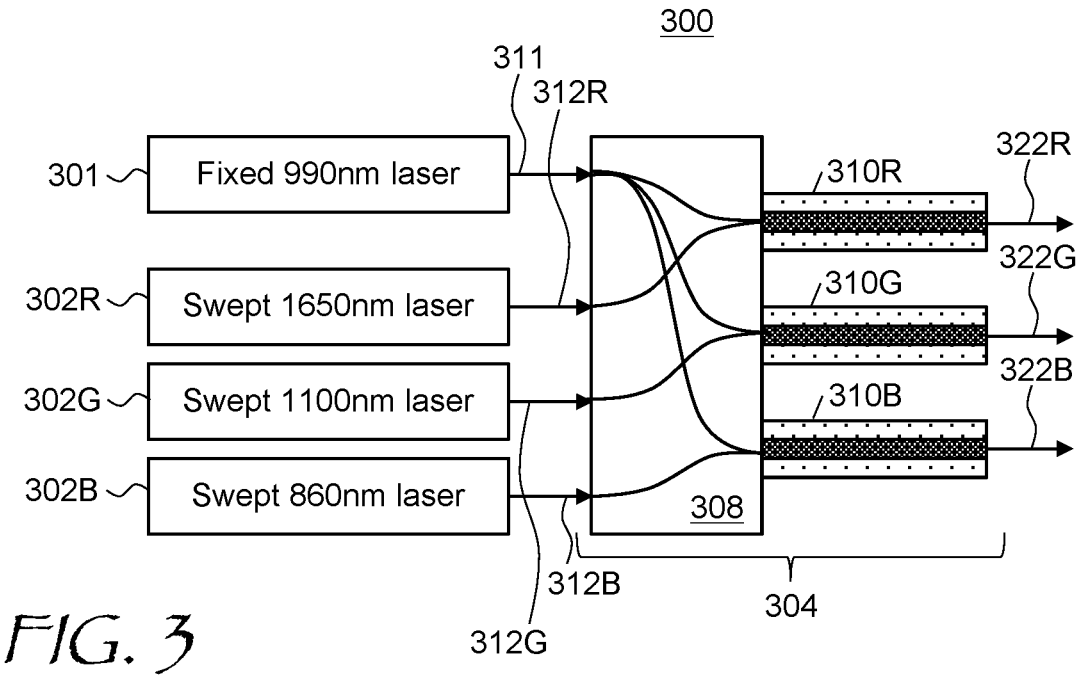
FIG. 3 is a schematic diagram of an embodiment of the light source of FIG. 1 including a fixed laser and a plurality of tunable lasers, for generation of visible light by SFG.

Referring now to FIG. 3, a light source 300 is an embodiment of the light source 100 of FIG. 1. In contradistinction to the light source 200 of FIG. 2, the light source 300 of FIG. 3 includes a fixed laser 301 for emitting light 311 at a fixed optical frequency, and a plurality of tunable lasers, in this example a red color channel tunable laser 302R, a green color channel tunable laser 302G, and a blue color channel tunable laser 302B, for emitting light 312R, 312G, and 312B, respectively at different tunable wavelengths/optical frequencies. In this particular example, all four lasers are infrared lasers: the fixed laser 301 emits light at a wavelength of 990 nm, the red channel tunable laser 302R emits light at a wavelength of 1650 nm, the green channel fixed laser 302G emits light at a wavelength of 1100 nm, and the blue channel fixed laser 302B emits light at a wavelength of 860 nm.

An optical frequency mixer 304 of the light source 300 is similar to the optical frequency mixer 204 of the light source 200 of FIG. 2. The optical frequency mixer 304 of FIG. 3 may include a PIC 308 or another suitable optical routing element coupled to a plurality of nonlinear optical elements 310R, 310G, and 310B such as quasi phase-matched crystals, for example lithium niobate (LiNbO3) quasi phase-matched poled crystal waveguide. The PIC 308 is configured for coupling the light 311 at the fixed optical frequency to each one of the plurality of nonlinear optical elements 310R, 310G, and 310B, and for coupling the light 312R, 312G, and 312B at each tunable optical frequency to the nonlinear optical elements 310R, 310G, and 310B, respectively. Each single light beam at a tunable optical frequency is coupled to a particular one of the plurality of nonlinear optical elements 310R, 310G, and 310B. Mixed optical frequencies of red, green, and blue output light beams 322R, 322G, and 322B is a sum frequency of the first (fixed) optical frequency and a particular one of the second (tunable) optical frequencies of the red color channel tunable laser 302R, a green color channel tunable laser 302G, and a blue color channel tunable laser 302B. To provide a reasonable nonlinear conversion efficiency at each optical frequency of the light 211 at the tunable optical frequency, the poling periods of the poled crystalline materials may be chirped as noted above with reference to FIG. 2. One advantage of the light source 300 of FIG. 3 as compared with the light source 200 of FIG. 2 is that wavelengths of the red, green, and blue output light beams 322R, 322G, and 322B are individually tunable.

Figure 4:
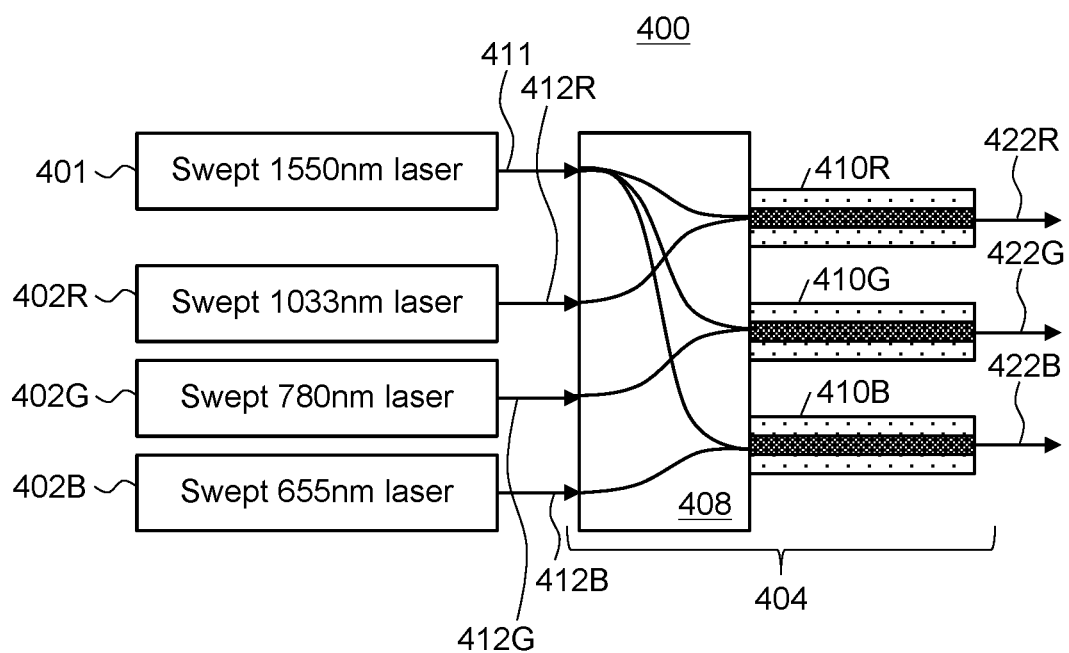
FIG. 4 is a schematic diagram of an embodiment of the light source of FIG. 1 including a plurality of tunable lasers for generation of visible light by SFG.

Turning to FIG. 4, a light source 400 is an embodiment of the light source 100 of FIG. 1. All laser sources of the light source 400 of FIG. 4 are tunable in wavelength/optical frequency, including a first laser 401 tunable around 1550 nm, and a plurality of second lasers, including a red channel laser 402R tunable around 1033 nm, a green channel laser 402G tunable around 780 nm, and a blue channel laser 402B tunable around 655 nm. An optical frequency mixer 404 is similar in construction and operation to the optical frequency mixer 304 of FIG. 3 and the optical frequency mixer 204 of FIG. 2. Briefly, the first laser 401 emits light 411 at first optical frequency, and a PLC 408 distributes the light 411 between nonlinear optical elements 410R, 410G, and 410B. Light 412R emitted by the red color channel laser 402R is coupled to the red color channel nonlinear optical element 410R, light 412G emitted by the green color channel laser 402G is coupled to the green color channel nonlinear optical element 410G, and light 412B emitted by the blue color channel laser 402B is coupled to the blue color channel nonlinear optical element 410B. Red 422R, green 422G, and blur 422B output light beams are obtain by sum frequency generation in respective nonlinear optical elements 410R, 410G, and 410B. One advantage of the light source 400 is an increased range of tuning of the output wavelengths, since all the lasers in this light source are independently tunable thereby extending the tunability range at the sum optical frequency.

Figure 5A:
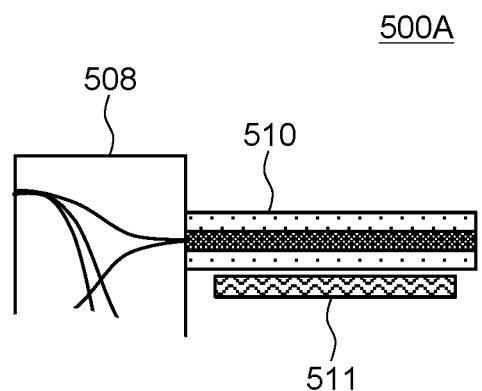
FIG. 5A is a partial cross-sectional side view of a light source embodiment with a heated poled crystal waveguide.

Referring to FIG. 5A, a light source 500A is similar in construction and operation to previously considered light sources 100, 200, 300, and 400. The light source 500A of FIG. 5A includes a PLC 508 coupled to a nonlinear optical element with phase matching, e.g. a poled crystalline material 510, for mixing optical frequencies of light propagating in the poled crystalline material 510. By way of non-limiting examples, the poled crystalline material 510 may include a bulk crystal, e.g. a lithium niobate bulk crystal cut into a desired shape, or a thin crystal layer on a dielectric substrate and subsequently fabricated into a waveguide. A heater 511 may be thermally coupled to the poled crystalline material 510 for providing a temperature gradient along the poled crystalline material 510. The thermal gradient creates a refractive index gradient due to a thermo-optic effect, and also may cause the poled crystalline material 510 to expand in a spatially varying manner, which causes the refractive index modulation strength and effective poling period of the poled crystalline material 510 to spatially vary. The degree of variation may be tuned by changing the amount of heat applied by the heater 511 to the poled crystalline material 510.

Figure 5B:
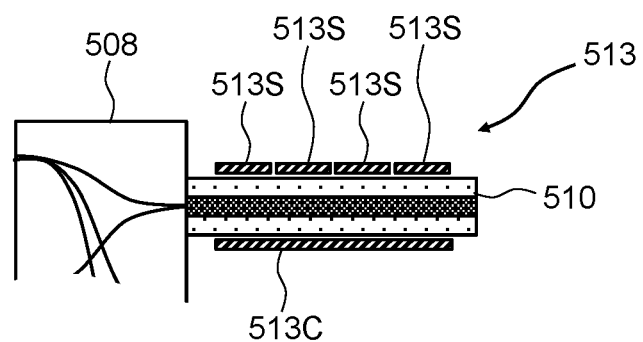
FIG. 5B is a partial cross-sectional side view of a light source embodiment with electric field tunable poled crystal waveguide.

Referring now to FIG. 5B, a light source 500B is similar to the light source 500A of FIG. 5A, and includes similar elements. The light source 500B of FIG. 5B includes a plurality of electrodes 513 instead of, or in addition to, the heater 511. The plurality of electrodes 513 may be configured for providing a stationary or dynamically varying electrical field gradient along the poled crystalline material 510. For example, in the embodiment shown in FIG. 5B, the plurality of electrodes 513 includes a common electrode 513C and segmented opposite electrodes 513S.

In operation, the electric field applied to the poled crystalline material 510 causes its refractive index to change due to an electro-optical effect. An electric field gradient applied to the poled crystalline material 510 causes the refractive index modulation strength of the poled crystalline material to spatially vary. The degree of variation may be tuned by changing the electric field gradient by applying voltages of different amplitudes to the plurality of electrodes 513.

Figure 6:
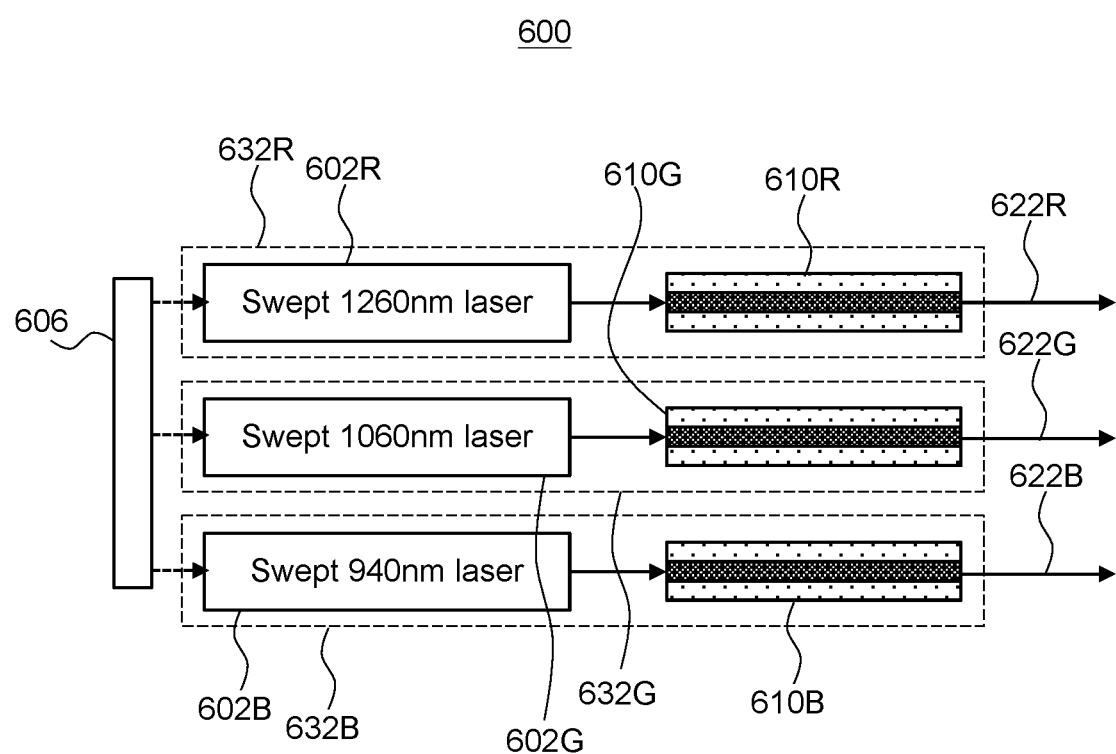
FIG. 6 is a schematic diagram of a tunable RGB light source, in which visible light of different color channels is obtained from infrared light by second harmonic generation (SHG)

Turning to FIG. 6, a tunable RGB light source 600 is an embodiment of the light source 100 of FIG. 1. The tunable RGB light source 600 of FIG. 6 includes red color channel 632R, green color channel 632G, and blue color channel 632B light sources. Each light source 632R, 632G, and 632B includes a tunable laser coupled to a nonlinear optical element. The tunable lasers are all infrared lasers in this example: the red light source 632R includes a laser 602R tunable around 1260 nm, coupled to a nonlinear optical element 610R; the green light source 632G includes a laser 602G tunable around 1060 nm, coupled to a nonlinear optical element 610G; and the blue light source 632B includes a laser 602B tunable around 940 nm, and coupled to a nonlinear optical element 610B. A controller 606 may be operably coupled to the tunable lasers 602R, 602G, and 602B of the 632R, green 632G, and blue 632B light sources, respectively, for synchronous or separate tuning optical frequencies of the tunable lasers 602R, 602G, and 602B. In the embodiment shown in FIG. 6, the nonlinear optical elements 610R, 610G, and 610B are frequency doubling crystals, providing output red 622R, green 622G, and blue 622B output beams at a higher optical frequency via second harmonic generation (SHG). The frequency doubling crystals may include, for example, poled frequency doubling crystal waveguides, which may be temperature controlled and/or electric-field tuned as explained above with reference to FIGS. 5A and 5B.

Figure 7:
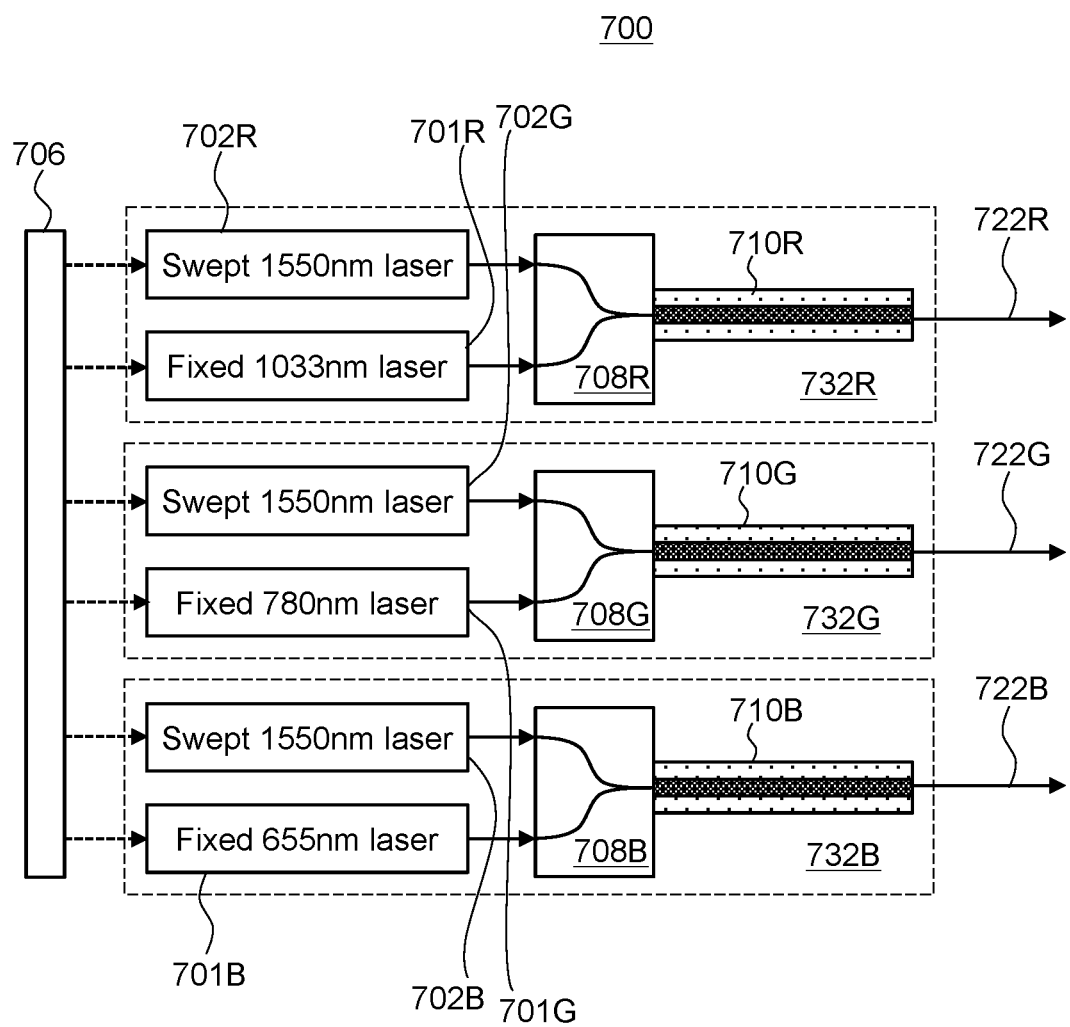
FIG. 7 is a schematic diagram of a tunable RGB light source, in which visible light of different color channels is obtained from infrared light by SFG of laser pairs.

Referring now to FIG. 7, a tunable RGB light source 700 is an embodiment of the light source 100 of FIG. 1. The tunable RGB light source 700 of FIG. 7 includes red 732R, green 732G, and blue 732B light sources coupled to an optional controller 706. Each light source includes a nonlinear optical element coupled to a fixed laser and a tunable laser by an optical combiner. Specifically, the red light source 732R includes a fixed laser 701R and a tunable (also termed swept) laser 702R coupled by an optical combiner 708R to a nonlinear optical element 710R; the green light source 732G includes a fixed laser 701G and a tunable laser 702G coupled by an optical combiner 708G to a nonlinear optical element 710G; and the blue light source 732B includes a fixed laser 701B and a tunable laser 702B coupled by an optical combiner 708B to a nonlinear optical element 710B. The nonlinear optical elements 710R, 710G, and 710B may each include, for example, a nonlinear optical crystal, such as a poled crystal or crystal waveguide, configured for mixing optical frequencies of the respective fixed and tunable lasers. The poling period may be chirped to provide the required conversion efficiency within the band of wavelength or optical frequency tuning. In the illustrated embodiment, the nonlinear optical elements 710R, 710G, and 710B are configured for providing an output light beam at a sum optical frequency of the respective fixed and tunable lasers, providing red 722R, green 722G, and blue 722B output light beams respectively. The controller 706 may be coupled to each tunable laser 702R, 702G, 702B, and to each fixed laser 701R, 701G, 701B, for controlling the laser output power and/or emission wavelength, as applicable, for provide the required power level and emission wavelengths of the red 722R, green 722G, and blue 722B output light beams generated by SFG.

Figure 8A:
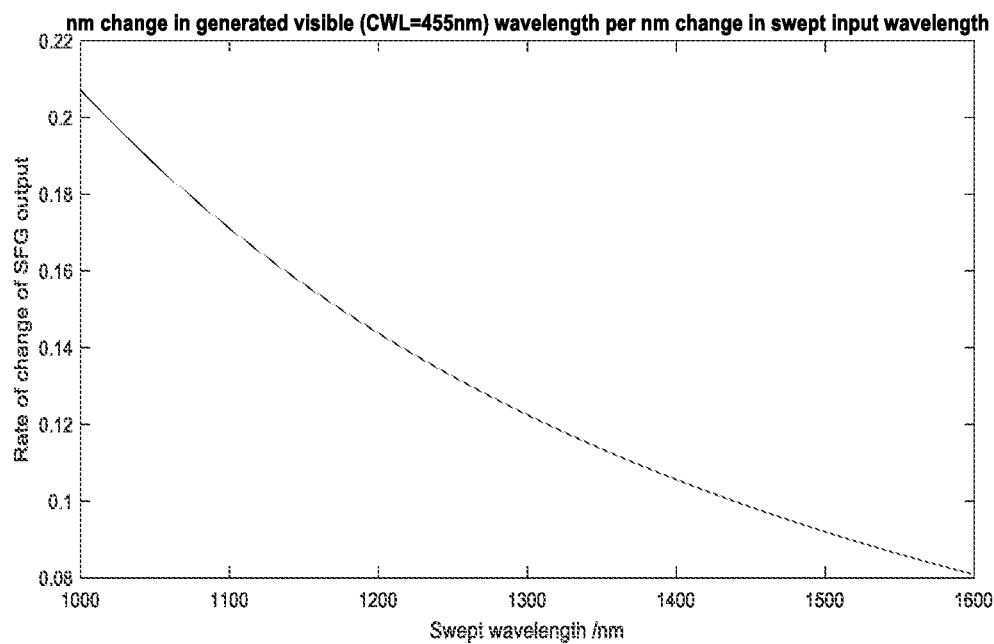
FIGS. 8A and 8B are graphs of percentage of a frequency converted blue and red light wavelength change, respectively, relative to infrared light wavelength change of a tunable infrared laser, for a light source based on SFG.
Figure 8B:
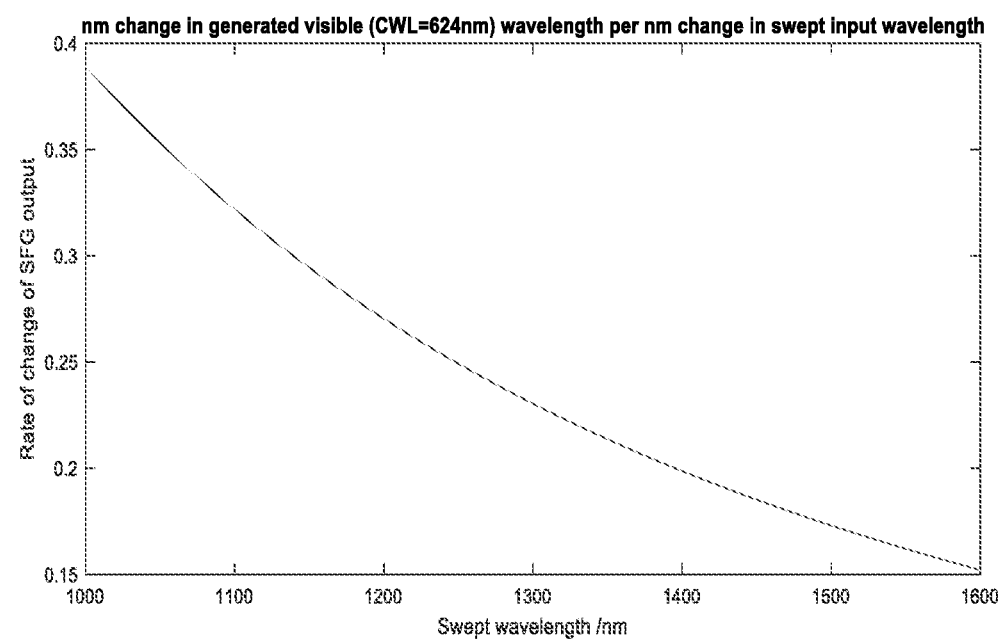

A wavelength of an output light beam generated by SFG of a fixed and tunable laser can be calculated from the following relationship:

$$\frac{c}{\lambda_{Visible}} = \frac{c}{\lambda_{Fixed}} + \frac{c}{\lambda_{Swept}} \quad (1)$$

where $\lambda_{Visible}$ is a wavelength of an output light beam, $\lambda_{Fixed}$ is an emission wavelength of the fixed-wavelength laser, $\lambda_{Swept}$ is an emission wavelength of a wavelength-tunable laser, and c is speed of light. It follows from (1) that as the wavelength of the tunable laser is swept, the wavelength of the visible output light beam is swept at a slower rate. FIGS. 8A and 8B show examples of nanometer per nanometer sweeping rate for blue and red output light beams, respectively. It is seen that, for example for blue light (FIG. 8A), the output beam wavelength changes at approximately 0.12 nm per 1 nm wavelength change of the swept infrared light beam at around 1300 nm. For red light (FIG. 8B), the output beam wavelength changes at a faster rate, approximately 0.23 nm per 1 nm wavelength change of the swept infrared light beam at around 1300 nm. Sweeping wavelengths of both infrared beams participating in SFG may further increase the attainable total wavelength tuning range. For SHG, the relationship is approximately 0.5 nm of the wavelength tuning of the visible light beam per 1 nm of the wavelength tuning of the infrared (fundamental) light beam. The relationship may be not exactly 0.5 nm per 1 nm due to material dispersion.

Figure 9A:
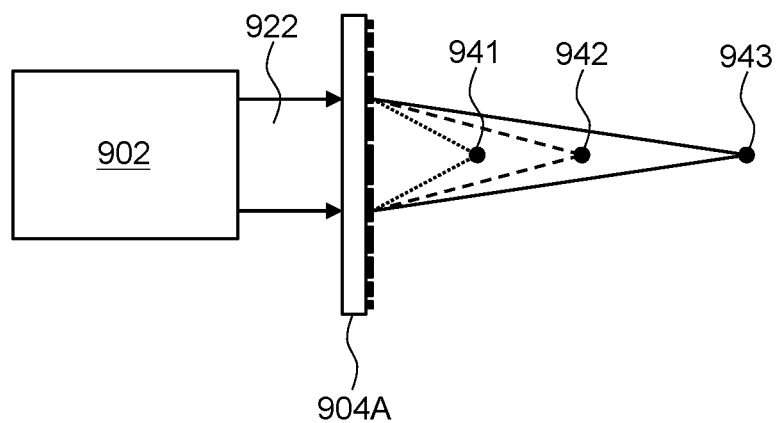
FIG. 9A is a schematic view of a projector for providing a light beam of a variable divergence.

Referring now to FIG. 9A, a projector 900A includes a wavelength-tunable visible light source 902, such as, for example, any of the light sources 100-700 of FIGS. 1-7 considered above. The wavelength-tunable visible light source 902 is optically coupled to a wavelength-dispersive element, in this case a diffractive lens 904A. Focal length of a diffractive lens or mirror depends strongly on the wavelength of impinging light. In operation, the diffractive lens 904A receives an output light beam 922 emitted by the wavelength-tunable visible light source 902 and changes a divergence of the output light beam 922 depending on the wavelength or optical frequency of the output light beam 922, which is controlled by the wavelength-tunable visible light source 902. Depending on the wavelength of the output light beam 922, the output light beam 922 may be focused at any one of locations 941, 942, or 943. The projector 900A of FIG. 9A is an example of an optical system where tuning a beam parameter, in this case the beam divergence, is achieved by tuning the optical frequency or wavelength of an output light beam. The spacing between the locations 941, 942, and 943 is exaggerated for clarity.

Figure 9B:
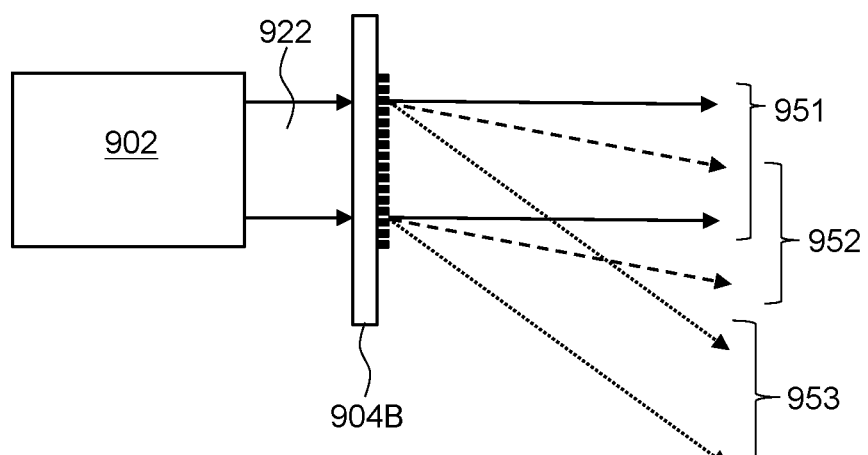
FIG. 9B is a schematic view of a scanning projector providing a light beam with a variable propagation direction.

Turning to FIG. 9B, a projector 900B includes the wavelength-tunable visible light source 902, e.g. any of the light sources 100-700 of FIGS. 1-7, optically coupled to a wavelength-dispersive element, specifically a diffraction grating 904B. In operation, the diffraction grating 904B receives the output light beam 922 emitted by the light source 902 and changes a direction of propagation of the output light beam 922 depending on the optical frequency or wavelength of the output light beam 922. Depending on the wavelength of the output light beam 922, the output light beam 922 may be directed at 951 (solid lines), 952 (dashed lines), or 953 (dotted lines). When the wavelength of the output light beam 922 is continuously tuned, the direction of the output light beam 922 is continuously swept. The projector 900B of FIG. 9B is an example of an optical system where tuning the optical frequency or wavelength of an output light beam results enables angular scanning of an output beam. An image in angular domain may be rastered this way by modulating the beam's intensity. Light beams carrying different color channels such as red, green, and blue color channels can be swept simultaneously by simultaneously sweeping the output beams wavelengths, rendering a color image. More generally, the light source 902 may be optically coupled to any element having an optical property depending on optical frequency or wavelength of output light beam 922. The tunability of the light source 902 will result in the optical property of a light beam downstream of the element being tuned. The optical property may include divergence, direction, power level, optical phase, etc.

When the light beams carrying individual color channels are swept in wavelength or optical frequency, their color changes slightly. This effect needs to be taken into account when rendering a color image. To keep the color coordinate at a required value, the optical power levels of the red, green, and blue color channel light beams may need to be adjusted depending on the current wavelengths of the output color beams.

Figure 10:
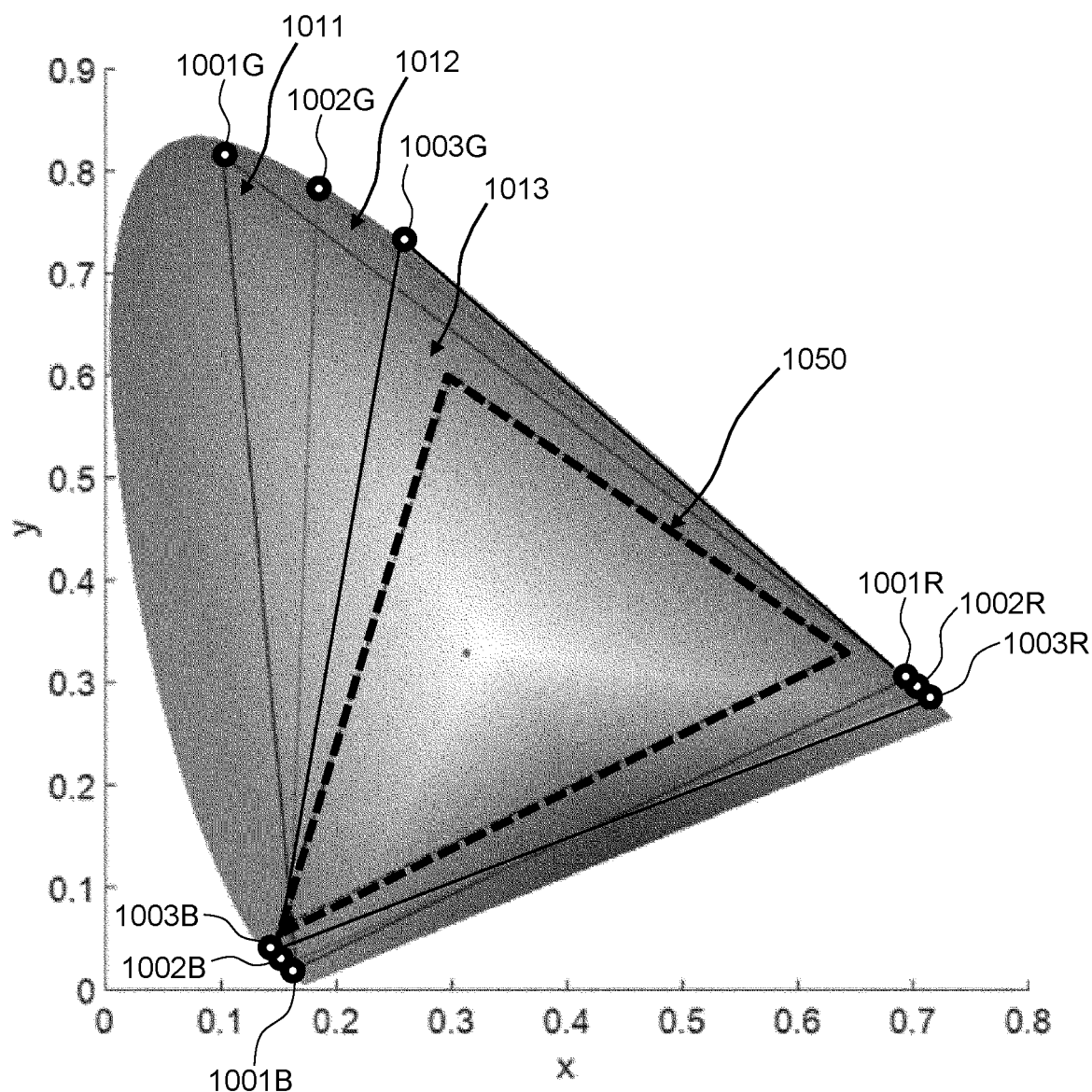
FIG. 10 is a color chart showing color coordinates of wavelength-tunable red, green, and blue light sources, and an achievable color space of a projector based on such light sources.

FIG. 10 illustrates a color space of a wavelength-scanned display in CIE x, y color coordinates. Points 1001R, 1002R, and 1003R denote color coordinates of a red channel light beam of the wavelength-scanned display as the wavelength of the red channel light beam is swept. Similarly, points 1001G, 1002G, and 1003G denote color coordinates of a green channel light beam of the wavelength-scanned display as the wavelength of the green channel light beam is swept; and points 1001B, 1002B, and 1003B denote color coordinates of a blue channel light beam of the wavelength-scanned display as the wavelength of the blue channel light beam is swept. Triangles 1011, 1012, and 1013 denote color space that is available by varying relative optical power of red, green, and blue light beams at the wavelengths corresponding to points 1001R, 1001G, 1001B; 1002R, 1002G, 1002B; and 1003R, 1003G, 1003B, respectively. A common area of the triangles 1011, 1012, and 1013, represented by a triangle 1050 (thick dashed lines), approximately denotes the sRGB color space and is a subset of the total color space available for a scanning color display where red, green, and blue light beams are scanned by tuning their respective wavelengths.

Figure 11:
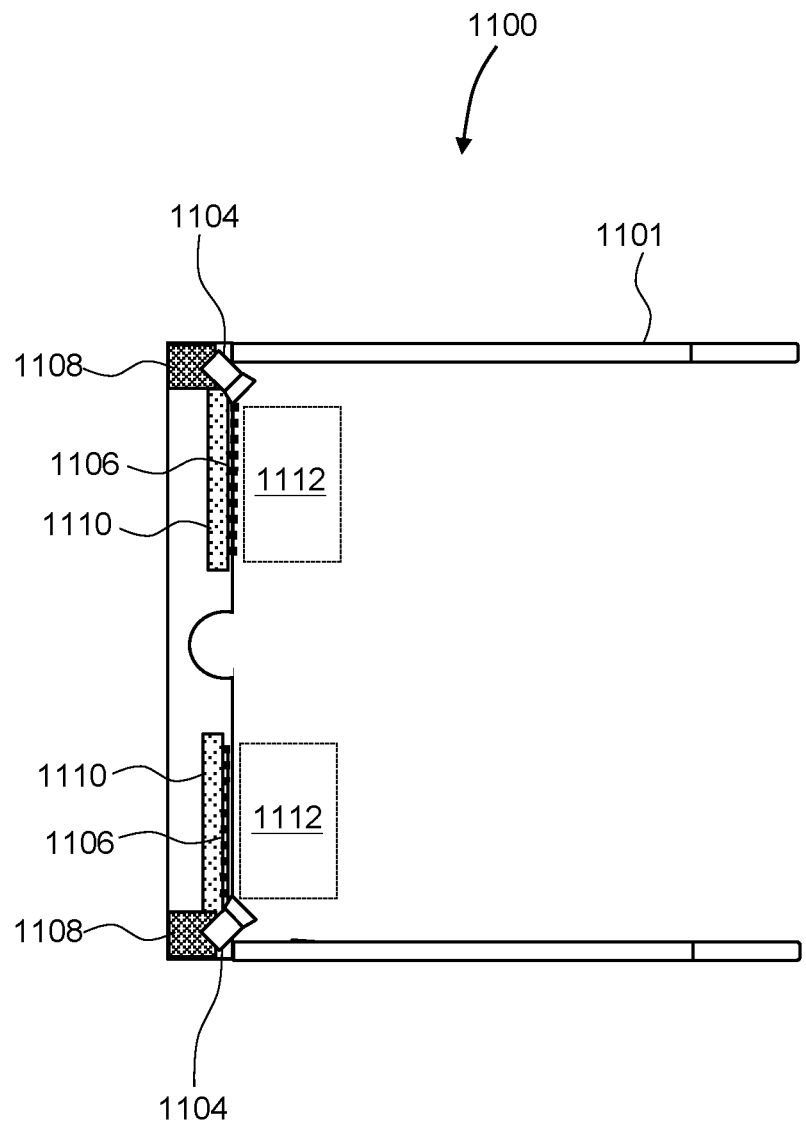
FIG. 11 is a view of an augmented reality (AR) display of this disclosure having a form factor of a pair of eyeglasses.

Turning to FIG. 11, an augmented reality (AR) near-eye display 1100 is an example optical system where light sources or projectors of this disclosure may be used. The AR near-eye display 1100 includes a frame 1101 having a form factor of a pair of eyeglasses. The frame 1101 supports, for each eye: a projector 1108, e.g. any projector described herein, a pupil-replicating waveguide 1110 optically coupled to the projector 1108, an eye-tracking camera 1104, and a plurality of illuminators 1106. The illuminators 1106 may be spread over the pupil-replicating waveguide 1110 for illuminating an eyebox 1112. The projector 1108 provides a fan of light beams carrying an image in angular domain to be projected into a user's eye. The pupil-replicating waveguide 1110 receives the fan of light beams and provides multiple laterally offset parallel copies of each beam of the fan of light beams, thereby extending the projected image over the eyebox 1112. Any of the light sources disclosed herein may be used in the projector 1108.

For AR applications, the pupil-replicating waveguide 1110 can be transparent or translucent to enable the user to view the outside world together with the images projected into each eye and superimposed with the outside world view. The images projected into each eye may include objects disposed with a simulated parallax, so as to appear immersed into the real world view.

The purpose of the eye-tracking cameras 1104 is to determine position and/or orientation of both eyes of the user. Once the position and orientation of the user's eyes are known, a gaze convergence distance and direction may be determined. The imagery displayed by the projectors 1108 may be adjusted dynamically to account for the user's gaze, for a better fidelity of immersion of the user into the displayed augmented reality scenery, and/or to provide specific functions of interaction with the augmented reality. In operation, the illuminators 1106 illuminate the eyes at the corresponding eyeboxes 1112, to enable the eye-tracking cameras to obtain the images of the eyes, as well as to provide reference reflections i.e. glints. The glints may function as reference points in the captured eye image, facilitating the eye gazing direction determination by determining position of the eye pupil images relative to the glints images. To avoid distracting the user with illuminating light, the latter may be made invisible to the user. For example, infrared light may be used to illuminate the eyeboxes 1112.

Embodiments of the present disclosure may include, or be implemented in conjunction with, an artificial reality system. An artificial reality system adjusts sensory information about outside world obtained through the senses such as visual information, audio, touch (somatosensation) information, acceleration, balance, etc., in some manner before presentation to a user. By way of non-limiting examples, artificial reality may include virtual reality (VR), augmented reality (AR), mixed reality (MR), hybrid reality, or some combination and/or derivatives thereof. Artificial reality content may include entirely generated content or generated content combined with captured (e.g., real-world) content. The artificial reality content may include video, audio, somatic or haptic feedback, or some combination thereof. Any of this content may be presented in a single channel or in multiple channels, such as in a stereo video that produces a three-dimensional effect to the viewer. Furthermore, in some embodiments, artificial reality may also be associated with applications, products, accessories, services, or some combination thereof, that are used to, for example, create content in artificial reality and/or are otherwise used in (e.g., perform activities in) artificial reality. The artificial reality system that provides the artificial reality content may be implemented on various platforms, including a wearable display such as an HMD connected to a host computer system, a standalone HMD, a near-eye display having a form factor of eyeglasses, a mobile device or computing system, or any other hardware platform capable of providing artificial reality content to one or more viewers.

The present disclosure is not to be limited in scope by the specific embodiments described herein. Indeed, other various embodiments and modifications, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A wavelength-tunable multi-beam light source comprising:
    a first laser for emitting light at a first optical frequency;
    a plurality of second lasers for emitting light at different second optical frequencies; and
    an optical frequency mixer coupled to the first laser and to the plurality of second lasers for nonlinear optical mixing of optical frequencies of the light emitted by the first laser and the light emitted by each one of the plurality of second lasers, to provide a plurality of output light beams at mixed optical frequencies;
    wherein at least one of the first laser or the plurality of second lasers is tunable in optical frequency, whereby each output light beam of the plurality of output light beams is wavelength-tunable.

2. The wavelength-tunable multi-beam light source of claim 1, wherein:
    the first laser is a tunable laser for emitting light at a tunable optical frequency, and each second laser of the plurality of second lasers is a fixed laser for emitting light at a fixed optical frequency; and
    the optical frequency mixer comprises a routing element and a plurality of nonlinear optical elements coupled to the routing element;
    wherein the routing element is configured for coupling the light at the tunable optical frequency to each one of the plurality of nonlinear optical elements, and for coupling the light at each fixed optical frequency to a particular one of the plurality of nonlinear optical elements, such that, when the first laser is tuned in optical frequency, each output light beam of the plurality of output light beams is synchronously tuned in wavelength.

3. The wavelength-tunable multi-beam light source of claim 1, wherein:
    the first laser is a fixed laser for emitting light at a fixed optical frequency, and each second laser of the plurality of second lasers is a tunable laser for emitting light at a tunable optical frequency; and
    the optical frequency mixer comprises a routing element and a plurality of nonlinear optical elements coupled to the routing element;
    wherein the routing element is configured for coupling the light at the fixed optical frequency to each one of the plurality of nonlinear optical elements, and for coupling the light at each tunable frequency to a particular one of the plurality of nonlinear optical elements, such that, when each second laser is tuned in optical frequency, each output light beam of the plurality of output light beams is independently tuned in wavelength.

4. The wavelength-tunable multi-beam light source of claim 1, wherein the optical frequency mixer comprises a photonic integrated circuit (PIC) and a plurality of nonlinear optical elements coupled to the PIC, wherein the PIC is configured for coupling light emitted by the first laser to each one of the plurality of nonlinear optical elements, and for coupling light emitted by each second laser to a particular one of the plurality of nonlinear optical elements.

5. The wavelength-tunable multi-beam light source of claim 4, wherein each one of the plurality of nonlinear optical elements is configured to provide one of the output light beams at a sum optical frequency of the first optical frequency and a particular one of the second optical frequencies.

6. The wavelength-tunable multi-beam light source of claim 1, wherein the plurality of output light beams comprises a light beam at a red wavelength, a light beam at a green wavelength, and a light beam at a blue wavelength, wherein the red, green, and blue wavelengths are variable by tuning at least one of: the first laser; or a second laser of the plurality of the second lasers.

7. The wavelength-tunable multi-beam light source of claim 1, wherein the optical frequency mixer comprises an optical routing element coupled to a plurality of nonlinear optical elements, wherein the optical routing element is configured for coupling the light at the first optical frequency to each one of the plurality of nonlinear optical elements, and for coupling the light at each second optical frequency to a particular one of the plurality of nonlinear optical elements.

8. The wavelength-tunable multi-beam light source of claim 1, further comprising an optical element configured to receive an output light beam of the plurality of output light beams for at least one of wavelength-dependent refocusing or wavelength-dependent redirecting of the output light beam.

9. The wavelength-tunable multi-beam light source of claim 7, wherein each one of the plurality of nonlinear optical elements comprises a quasi-phase-matched nonlinear optical element.

10. The wavelength-tunable multi-beam light source of claim 9, wherein the quasi-phase-matched nonlinear optical element comprises a poled crystalline material, wherein a poling period of the poled crystalline material is chirped, with the poling period varying by at least 0.1% and no more than 50% of a median value of the poling period.

11. The wavelength-tunable multi-beam light source of claim 10, further comprising a plurality of electrodes in proximity of the poled crystalline material for providing a stationary or dynamically variable electrical field gradient along the poled crystalline material for varying phase matching of the poled crystalline material by using an electro-optical effect.

* * * * *